United States Patent
Eleftheriadis et al.

(10) Patent No.: US 10,587,148 B2
(45) Date of Patent: Mar. 10, 2020

(54) RADIO BASE STATION POWERED USING WIRELESS POWER

(71) Applicant: Telefonaktiebolaget LM Ericsson (publ), Stockholm (SE)

(72) Inventors: Lackis Eleftheriadis, Gävle (SE); Per Eklund, Lidingö (SE); Jan-Erik Lundberg, Sollentuna (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 15/569,214

(22) PCT Filed: Apr. 27, 2015

(86) PCT No.: PCT/SE2015/050471
§ 371 (c)(1),
(2) Date: Oct. 25, 2017

(87) PCT Pub. No.: WO2016/175686
PCT Pub. Date: Nov. 3, 2016

(65) Prior Publication Data
US 2018/0175667 A1 Jun. 21, 2018

(51) Int. Cl.
*H02J 50/10* (2016.01)
*H05K 5/00* (2006.01)
*H01F 38/14* (2006.01)
*H02J 5/00* (2016.01)
*H02J 7/00* (2006.01)
*H05K 7/02* (2006.01)

(52) U.S. Cl.
CPC .............. *H02J 50/10* (2016.02); *H02J 5/005* (2013.01); *H02J 7/0045* (2013.01); *H05K 5/0021* (2013.01); *H05K 7/023* (2013.01); *H01F 38/14* (2013.01)

(58) Field of Classification Search
CPC .. H02J 50/12; H02J 7/025; H02J 5/005; H02J 50/10; H02J 17/00; H02J 50/80; H02J 7/0045; H01F 38/14; H01F 2027/2809; H04B 5/0037; H05K 7/023; H05K 5/0021
See application file for complete search history.

(56) References Cited

U.S. PATENT DOCUMENTS

| | | | |
|---|---|---|---|
| 3,054,024 A | 9/1962 | Dillen et al. | |
| 7,184,272 B1 | 2/2007 | Harlacher et al. | |
| 9,997,292 B2 * | 6/2018 | An | H02J 17/00 |
| 2004/0198101 A1 | 10/2004 | Rapp | |

(Continued)

OTHER PUBLICATIONS

International Search Report and Written Opinion issued in International Application No. PCT/SE2015/050471, dated Mar. 31, 2016, 18 pages.

*Primary Examiner* — James Wu
(74) *Attorney, Agent, or Firm* — Rothwell, Figg, Ernst & Manbeck, P.C.

(57) ABSTRACT

Disclosed is a power supply unit, PSU, for wirelessly powering components of a radio base station, RBS, such as a radio unit, RU, transmission units (TMR) and a baseband digital unit, BDU. The PSU includes a TX coil for generating an energy field that is used to induce a current and voltage in an RX coil that is part of a component of the base station. The need for power cables, which are inefficient at transferring energy, is therefore greatly reduced. Hence, the energy efficiency of the RBS is increased.

5 Claims, 9 Drawing Sheets

(56) References Cited

U.S. PATENT DOCUMENTS

| | | |
|---|---|---|
| 2012/0228957 A1 | 9/2012 | Miyauchi |
| 2013/0241300 A1* | 9/2013 | Miyamoto .............. H01F 5/003 307/104 |
| 2013/0312450 A1 | 11/2013 | Iwasa et al. |
| 2016/0285300 A1* | 9/2016 | Summers ................ H02J 7/025 |

* cited by examiner

RADIO BASE STATION POWERED USING WIRELESS POWER

CROSS REFERENCE TO RELATED APPLICATION(S)

This application is a 35 U.S.C. § 371 National Stage of International Patent Application No. PCT/SE2015/050471, filed Apr. 27, 2015, designating the United States, the disclosure of which is incorporated by reference.

TECHNICAL FIELD

This disclosure relates to system and methods for providing power wirelessly to components of a radio base station for use in a telecommunications network.

BACKGROUND

A typical design for a radio base station (RBS) (e.g., a 19" radio base station) requires a separate power distribution unit (PDU) to feed and transfer power to the base station's baseband digital unit (BDU) and radio units (RU). This requires many power cables between the PDU and components of the base station (e.g., BDU and RUs) to supply the power. The typical design and power architecture is not energy efficient due to, among other things, the many cables needed to deliver power from the PDU to the BDU and RUs. These cables create a high power distribution loss. The power losses in the PDU and cables are very high compared to the total system power efficiency (distributed transfer power from the AC line to the DC loads). Another problem in a high capacity installation is that the number of cables required in the system create an inflexible design. With all the required cables, the RBS system is not a true plug and play system. Another problem caused by the power distribution cables is the time consuming aspect of the cable installation when manufacturing the RBS in the factory.

What is desired, therefore, is a new and improved power distribution architecture.

SUMMARY

This disclosure provides a wireless power transfer apparatus (WPTA) for supplying power wirelessly to components of a radio base station. Embodiments of the WPTA increase the energy efficiency of the RBS compared with the current power architecture. For example, using a wireless power transfer apparatus (WPTA) according to some embodiments to replace the conventional PDU unit and power cables can lead to a reduction of power consumption of 220 W or better, thereby increasing the energy efficiency for a 19" Radio base station by 2.4% (for a maximum power need of 10 KW system). In some embodiments, the WPTA includes a power supply unit (PSU) having an inductive wireless power transmit (TX) module having a TX coil. The RUs and BDU of the base station are modified to include a wireless power receive (RX) module having an RX coil. Advantageously, in some embodiments, the TX module the corresponding RX modules are well matched and aligned to efficiently transfer the energy that is required by the RU and BDU.

By implementing and applying an inductive wireless power transfer (WPT) apparatus and by changing/breaking up the current power architecture of the RBS the benefits are many. First, as mentioned above, in some embodiments the WPTA lowers energy consumption (increased energy efficiency) compared with today's architecture. In some configurations, the WPTA increases the efficiency by 2.4% at full load and 1.2% at half load. Second, in some embodiments the WPTA enables an easy installation by removing the power cables and signaling to the BDU/RU and decreased manufacturing complexity on node level, also it enables an easy installation and configuration on site. Third, in some embodiments, the WPTA enables a more compact solution for a 19" installation in a mounting rack system. The solution is more compact because the PSU TX coil and corresponding RX coil module in the BDU/RU are interacting with each other by transferring the power point to point, directly from PSU to BDU/RU. Fourth, in some embodiments, the wireless interaction between PSU and BDU/RU eliminates the DC/DC power steps in the RBS power chain and enables an optimized complete e2e power transfer solution. Fifth, by removing the power cables, problems with the power connectors are removed.

DETAILED DESCRIPTION

Figure 1:
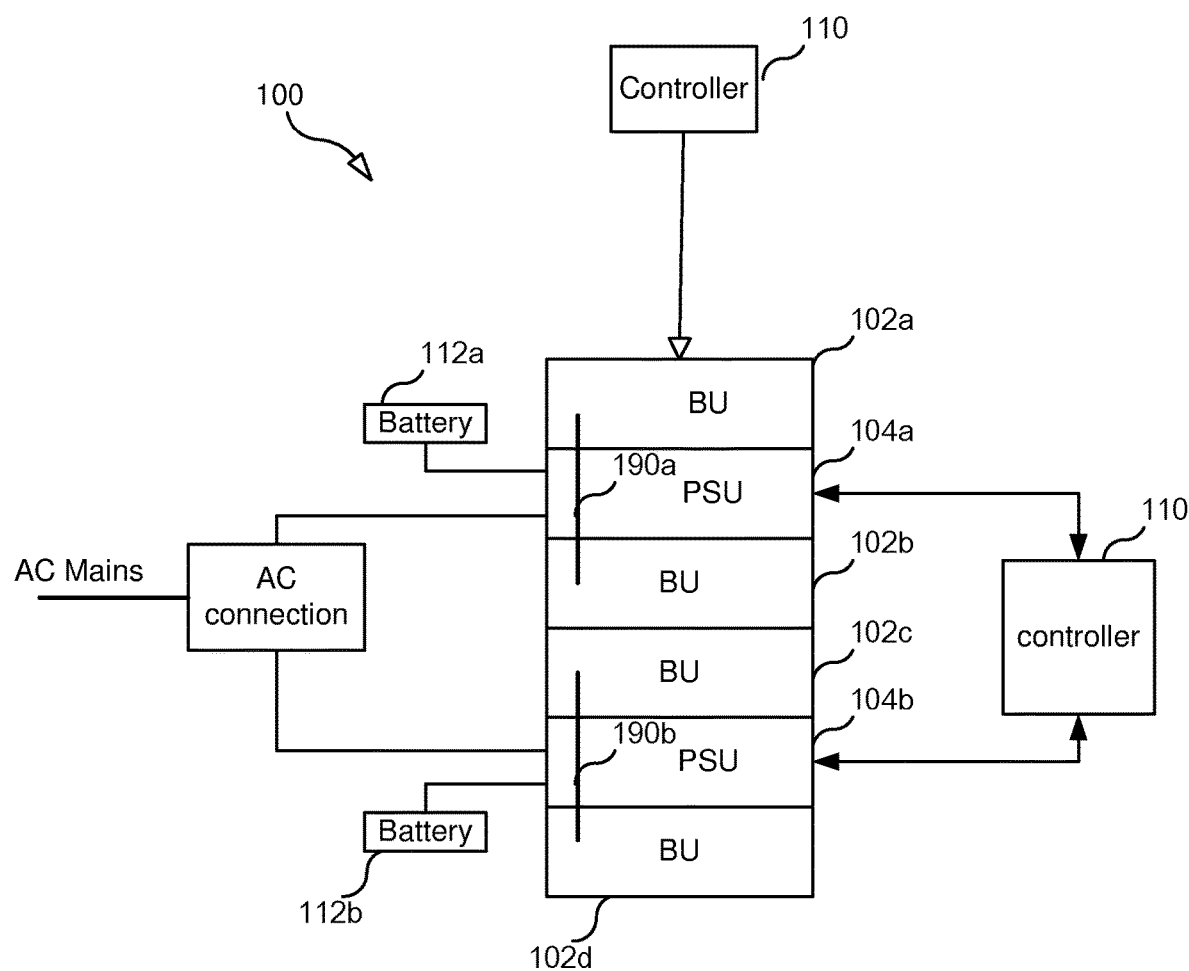
FIG. 1 illustrates an RBS according to some embodiments.

FIG. 1 illustrates a radio base station (RBS) 100 according to some embodiments. As is known in the art of cellular communications, RBS 100 includes one or more base station units (BUs), such as one or more baseband digital units (DUs), one or more radio units (RUs) and on or more transmission units (TMR) (in this example four BUs are shown: BU 102a, BU 102b, BU 102c and BU 102d). As is known in the art, an RU includes transmitter circuitry for use in transmitting traffic data wirelessly via one or more antennas. This transmitter circuitry typically includes a power amplifier, among other components, that is coupled to an antenna via a duplex filter.

In the embodiment shown, the BUs 102 of RBS 100 are powered wirelessly by two wireless power supply units (PSUs) 104a, 104b. In other embodiments, RBS 100 may include more or less than two PSUs. PSU 104a is located directly between BUs 102a and 102b and PSU 104a produces a time-varying energy field 190a (e.g., a magnetic field and/or an electric field) that is received by both a receive (RX) coil of BU 102a and an RX coil of BU 102b. This energy field 190a induces a current and voltage in the coils, which are used to provide power to BU 102a and BU 102b. Likewise, PSU 104b is located directly between BU 102c and BU 102d and produces a time-varying energy field 190*b* that is received by an RX coil of BU 102*c* and an RX coil of BU 102*d*, which induces a current and voltage in the RX coils that is used to provide power to BU 102*c* and BU 102*d*. A controller 110 can be used to control the amount of power that the PSUs 104 provide to the components of RBS 100. Additionally, in some embodiments, PSUs 104*a* and 104*b* may be connected to external batteries 112*a* and 112*b*, respectively, via a battery module inside the PSU (see e.g., element 622 of FIG. 6).

Figure 2:
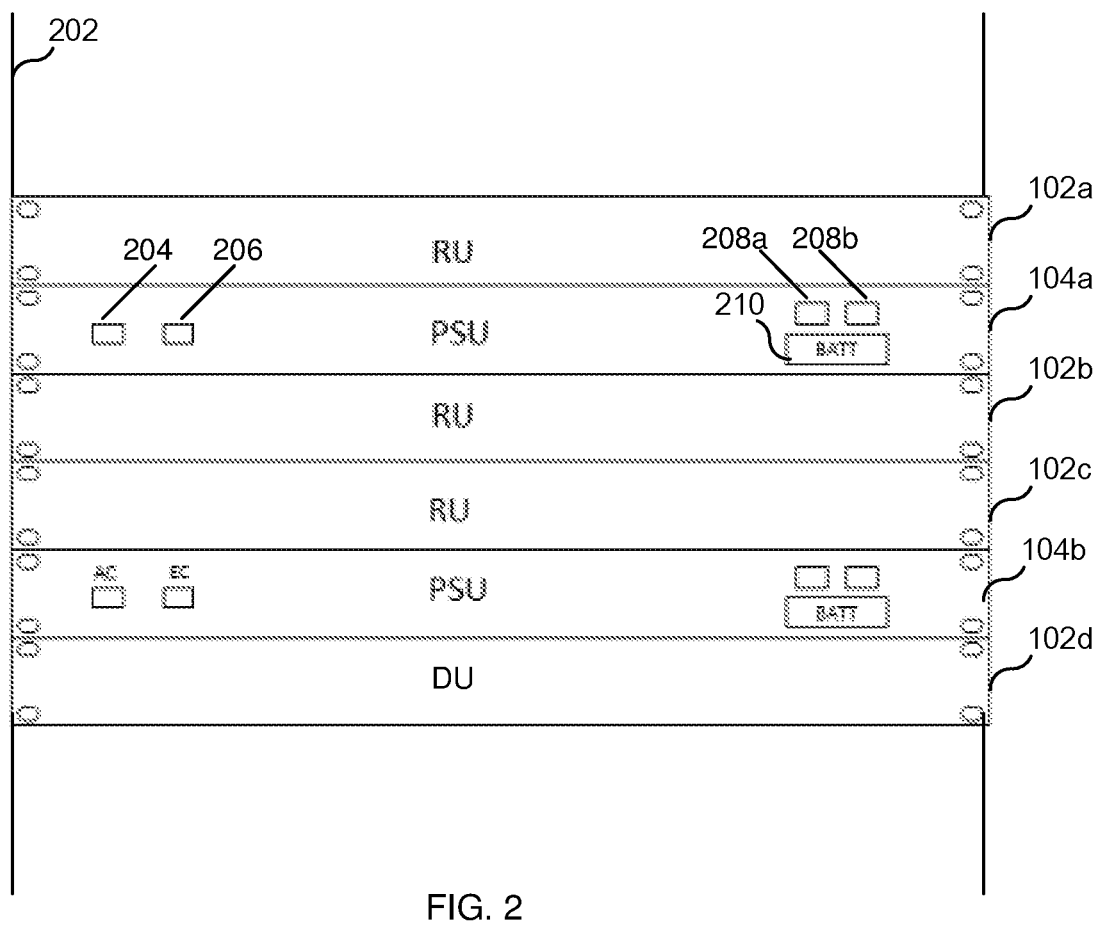
FIG. 2 illustrates a 19 inch RBS according to some embodiments.

FIG. 2 illustrates an embodiment of RBS 100 in which BUs 102*a*, 102*b* and 102*c* are each an RU and BU 102*d* is a BDU. Additionally, as shown in FIG. 2, RUs 102*a*,*b*,*c*, PSUs 104 and BDU 102*d* are all attached to a standard 19 inch rack (or 23 inch rack) 202 (i.e., RBS 100 is a 19" radio base station). Additionally, FIG. 2 shows that, in some embodiments, the front panel of PSU 104 includes an AC connector 204 for receiving AC power, an EC connector 206 (e.g., a serial port) for connecting PSU 104 to a controller, two power output ports 208*a* and 208*b*, and a battery port 210 for connecting PSU 104 to an external battery, which PSU 104 can charge.

Figure 3:
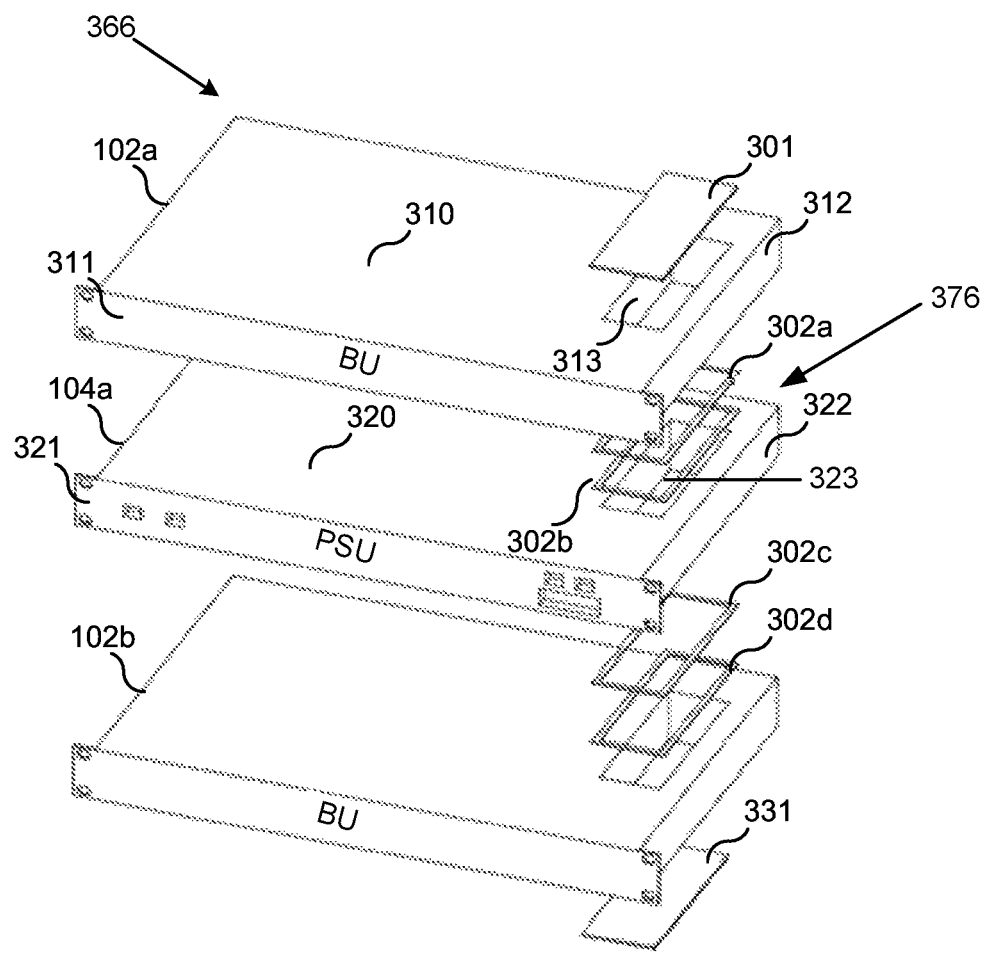
FIG. 3 is an exploded view of an RBS according to some embodiments.
Figure 4:
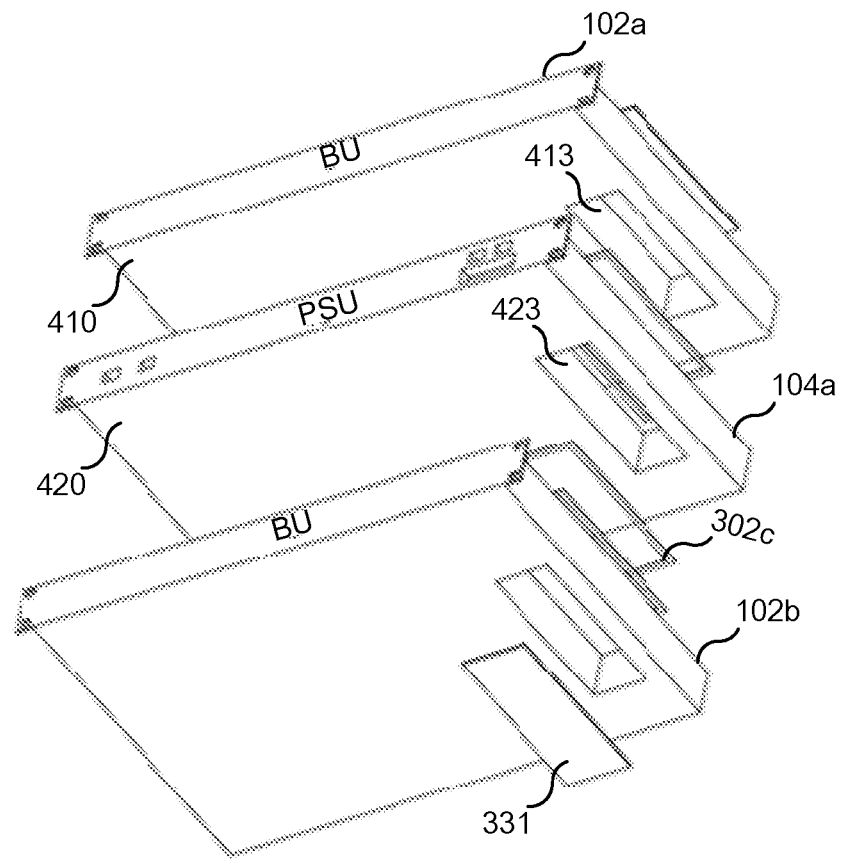
FIG. 4 is an exploded view of an RBS according to some embodiments.

FIGS. 3 and 4 are exploded views of RBS 100 according to some embodiments. FIG. 3 shows that each BU 102 includes a BU housing 366 having a main wall 310 (a.k.a., top wall), another main wall 410 (a.k.a., bottom wall) and four side walls extending between the top and bottom walls (two of the side walls, wall 311 and wall 312 are visible in FIG. 3). In the embodiment shown, each BU 102 also includes a hole 313 formed in the main wall 310 (top wall 310) and a hole 413 formed in the main wall 410 (bottom wall 410). Although not shown in FIGS. 3 and 4, an RX coil 502 (see FIG. 5A) is located directly between holes 313 and 413.

Similarly, each PSU 104 includes a PSU housing 376 having a main wall 320 (a.k.a., top wall), another main wall 420 (a.k.a., bottom wall) and four side walls extending between the top and bottom walls (two of the side walls, wall 321 and wall 322 are visible in FIG. 3). In the embodiment shown, each PSU 104 also includes a hole 323 formed in the main wall 320 (top wall 320) and a hole 423 formed in the main wall 420 (bottom wall 410). Although not shown in FIGS. 3 and 4, a TX coil 504 (see FIG. 5B) is located directly between holes 323 and 423.

In some embodiments, to reduce interference caused by the energy field generated by TX coil 504 (e.g., energy field 190*a*), energy field (EF) shielding is employed, such as an Electromagnetic Interference (EMI) shield and/or Electromagnetic Field (EMF) shield, to prevent certain components from being exposed to the energy field. For example, as shown in FIGS. 3 and 4, an EF shield 302*a* is located on the outer surface of bottom wall 410 of BU 102*a* and this shield 302*a* surrounds hole 413; similarly an EF shield 302*b* is located on the outer surface of top wall 320 of PSU 104*a* and this shield 302*b* surrounds hole 323, and an EF shield 302*c* is located on the outer surface of bottom wall 420 of PSU 104*a* and this shield 302*c* surrounds hole 423. EF shields 302*a* is further shown in FIG. 5A.

Figure 5A:
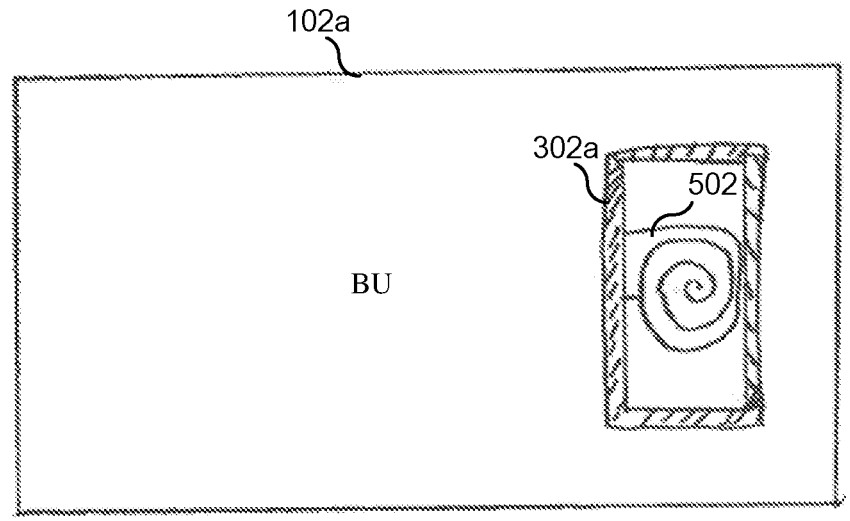
FIG. 5A illustrates the use of shielding according to some embodiments.

FIG. 5A is a view of bottom wall 410 of BU 102*a* and shows shield 302*a* completely surrounding hole 413. FIG. 5A also shows RX coil 502 being located directly beneath hole 413. EF shields 302*a*, 302*b*, and 302*c* are further shown in FIG. 5B.

Figure 5B:
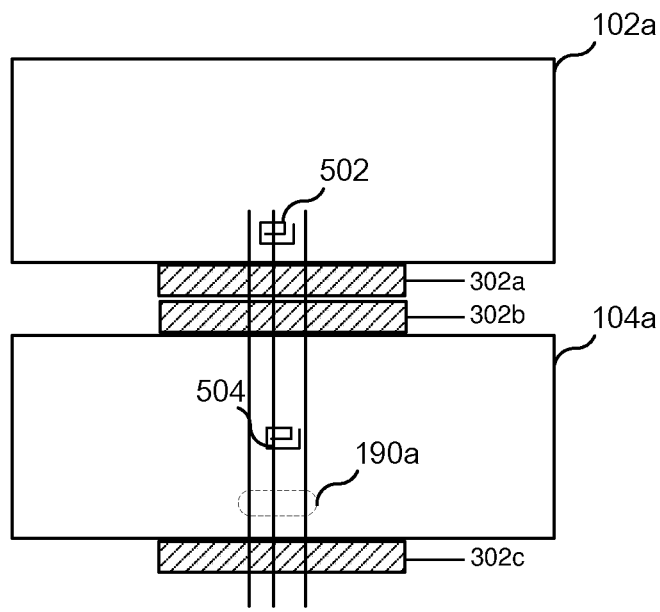
FIG. 5B further illustrates the use of shielding according to some embodiments.

FIG. 5B is a side view showing that when BU 102*a* and PSU 104A are inserted into rack 202, EF shield 302*a* will abut EF shield 302*b*, thereby preventing (or limiting) interference caused by the energy field generated by TX coil 504.

To transfer energy most efficiently from TX coil 504 to RX coil 502, the coils should be aligned (e.g., RX coil 502 should be directly above/beneath TX coil) and in close proximity. In some embodiments, the distance from TX coil 504 to RX coil 502 is about one centimeter, or smaller.

In configurations where an BU 102 is located directly on top of PSU 104*a* (see e.g., BU 102*a* in FIG. 3), then the hole 313 formed in the top wall 310 can be covered with an EF shield plate 301, as shown in FIG. 3. Likewise, when an BU 102 is located directly underneath PSU 104*a* (see e.g., BU 102*b* in FIG. 3), then the hole 413 formed in the bottom wall 410 can also be covered with an EF shield plate 331, as shown in FIG. 4.

Figure 6:
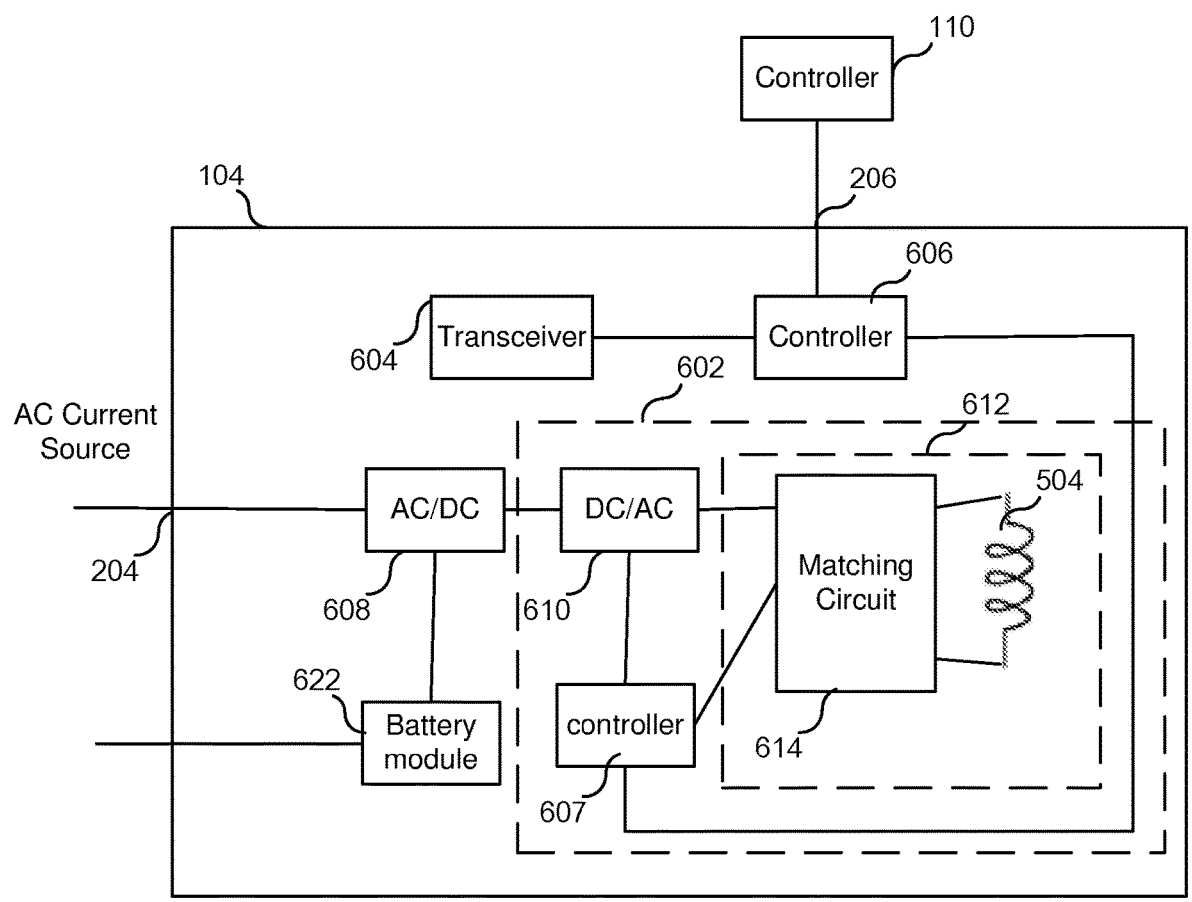
FIG. 6 is a functional block diagram of a PSU according to some embodiments.

FIG. 6 is a functional block diagram illustrating functional components of each PSU 104, which components include, in some embodiments, a wireless transmit (TX) power module 602, an AC to DC (AC/DC) converter circuit 608 for converting AC mains to a DC voltage, and a PSU controller 606. AC/DC circuit 608 may include or consist of a power factor correction (PFC) circuit that rectifies the AC voltage to DC voltage. As shown in FIG. 6, TX power module 602 includes, in some embodiments, DC to AC converter circuit (DC/AC) 610, a matching circuit 614, TX coil 504, and a TX power module controller 607 for controlling DC/AC 610 and/or matching circuit 614 based on commands from controller 606.

The DC signal produced by AC/DC 608 is fed into a DC/AC circuit 610 to produce an AC signal, which is provided to TX coil 504 via matching circuit 614. As is known in the art, DC/AC circuit 610 may include: i) a switching circuit comprising power transistors, such as, for example, a half bridge circuit or full bridge circuit (a.k.a., H bridge), and ii) a drive circuit (e.g., a pulse width modulator (PWM)) for driving the power transistors of the switching circuit (in some embodiments the drive circuit is a component of controller 607). As a result of the AC signal produced by DC/AC 610 and provided to TX coil 504, a time-varying energy field (e.g., a magnetic field and/or electric field) is generated by TX coil 504, which energy field is used to power one or more BUs 102.

The PSU controller 606 of PSU 104 is operable to control DC/AC circuit 610 and/or matching circuit 614 via commands sent to controller 607 (or directly in some embodiments). Controller 606 may control DC/AC circuit 610 and/or matching circuit 614 based on i) commands transmitted by a BU 102 and received via a transceiver 604 and/or ii) commands transmitted by controller 110 and received via EC connector 206. For example, based on commands from BU 102 or controller 110, controller 606 can control the frequency of the AC signal produced by DC/AC converter 610. Controller 606 can also be configured to control the resonant frequency of TX power circuit 612, which includes TX coil 504 and matching circuit 614. For example, matching circuit 614 in some embodiments may include switches, which are controlled by controller 607 based on commands from controller 606 (in some embodiments, however, controller 606 may directly control the switches), for connecting and disconnecting one or more capacitors and/or inductors to matching circuit 614, thereby adjusting the resonant frequency of TX power circuit 612. In response to receiving a command, controller 606 may transmit to the sender of the command an acknowledgement.

In some embodiments, PSU 104 may include a battery module 622. Battery module 622 includes a battery switch and converter controlled from controller 110. The battery charge functions and functionality are combined inside the PSU unit and have the capability to charge an external battery backup when needed. Charge power to the batteries is supplied via AC/DC circuit 608 (e.g., PFC) and the battery module by setting the needed voltage (−48 VDC) to charge power via a separate connector. During AC outage battery backup is providing power to the PSU.

Figure 7:
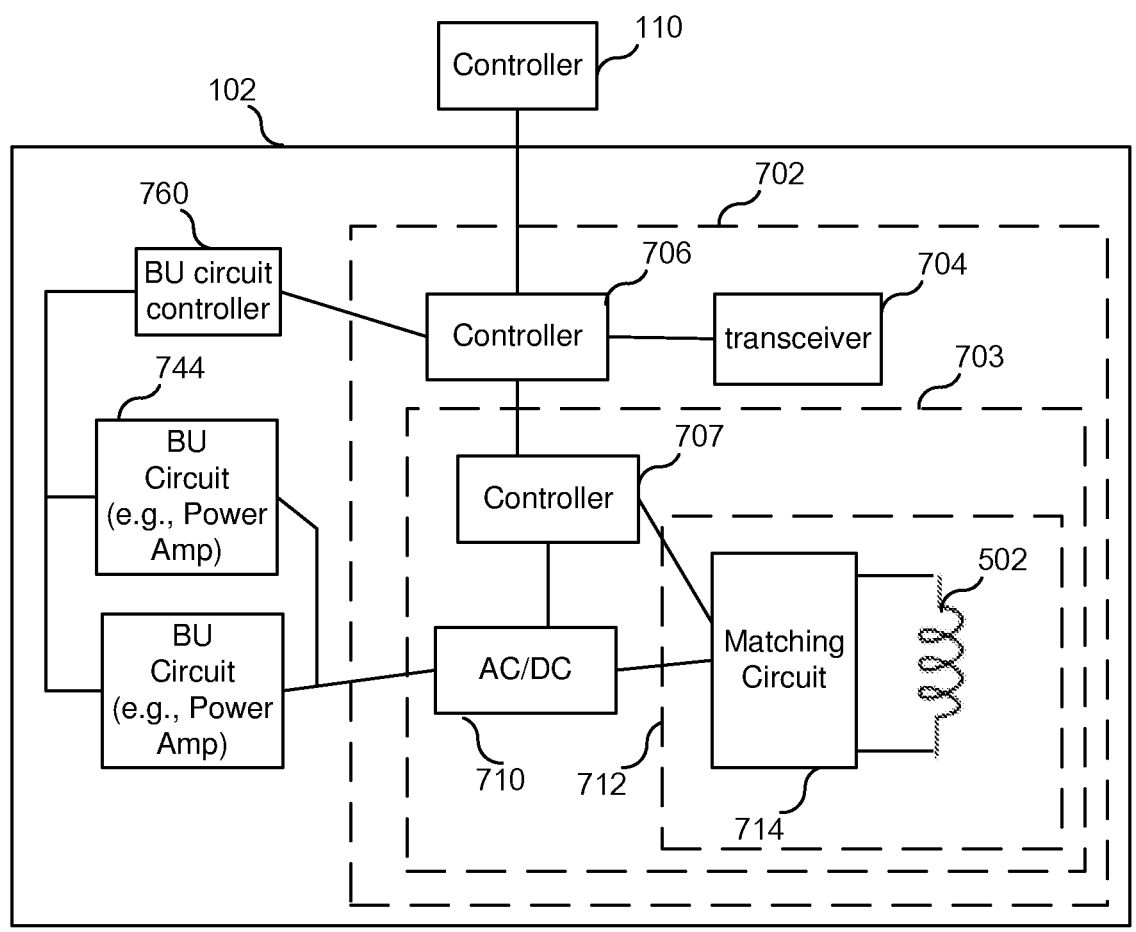
FIG. 7 is a functional block diagram of an BU according to some embodiments.

FIG. 7 is a functional block diagram illustrating functional components of each BU 102, which components includes a wireless receive (RX) power module 702 comprising one or more wireless RX power units 703 for delivering power to one or more BU circuits 744 of BU 102. When BU 102 is an RU, each BU circuit 744 may include a power amplifier (as well as other components for wirelessly transmitting data) coupled to an antenna via a filter (e.g., duplex filter) and one or more Point-of-Load (POL) converters (e.g., DC/DC converters). Each wireless RX power unit 703 includes an AC/DC converter circuit 710 and an RX power circuit 712. Each wireless RX power unit 703 may also include a controller 707 for controlling AC/DC circuit 710 and/or matching circuit 714. AC/DC circuit 710 receives an AC signal generated by RX power circuit 712 and produces a DC output. The DC output is used to power BU circuits 744. In some embodiments, AC/DC circuit 710 includes or consists of a rectifier. RX power circuit 712 includes a matching circuit 714 and an RX coil 502. As discussed above, when BU 102 is in operation, RX coil 502 is positioned so that the energy field produced by TX coil 504 will induce a current and a voltage in RX coil 502. Preferably, the RX power circuit 712 and the TX power circuit 612 are well matched so that the energy will be transferred efficiently.

A controller 706 of BU 102 is operable to control AC/DC circuit 710 and/or matching circuit 714 via commands sent to controller 707 and/or directly. Controller 706 may control AC/DC circuit 710 and/or matching circuit 714 based on i) commands transmitted by a BU circuit controller 760 and/or ii) commands transmitted by controller 110 and received via EC connector 206. For example, based on commands from controller 706 or controller 110, controller 706 can control the resonant frequency of RX power circuit 712, which includes RX coil 502 and matching circuit 714. For example, matching circuit 714 in some embodiments may include switches, which are controlled by controller 706 via command sent to controller 707 or directly, for connecting and disconnecting one or more capacitors and/or inductors to matching circuit 714, thereby adjusting the resonant frequency of TX power circuit 712.

In some embodiments, BU 102 includes a transceiver 704 for transmitting commands intended to be received by transceiver 604 and for receiving status information (e.g., acknowledgements) transmitted by transceiver 604. For example, when BU 102 adjusts the resonant frequency of circuit 712, among other things, BU 102 transmits data (e.g., a command) using transceiver 704, which data is then received by transceiver 604 and provided to controller 606, which may be programmed to adjust correspondingly the resonant frequency of circuit 612 and to employ the transceiver transmit an acknowledgement. In some embodiments, transceiver 704 is, or comprises, a wireless transmitter, and transceiver 604 is, or comprises, a wireless receiver. For example, transceiver 704 may include an Infrared (IR) transmitter, and transceiver 604 may include an IR detector.

Figure 8:
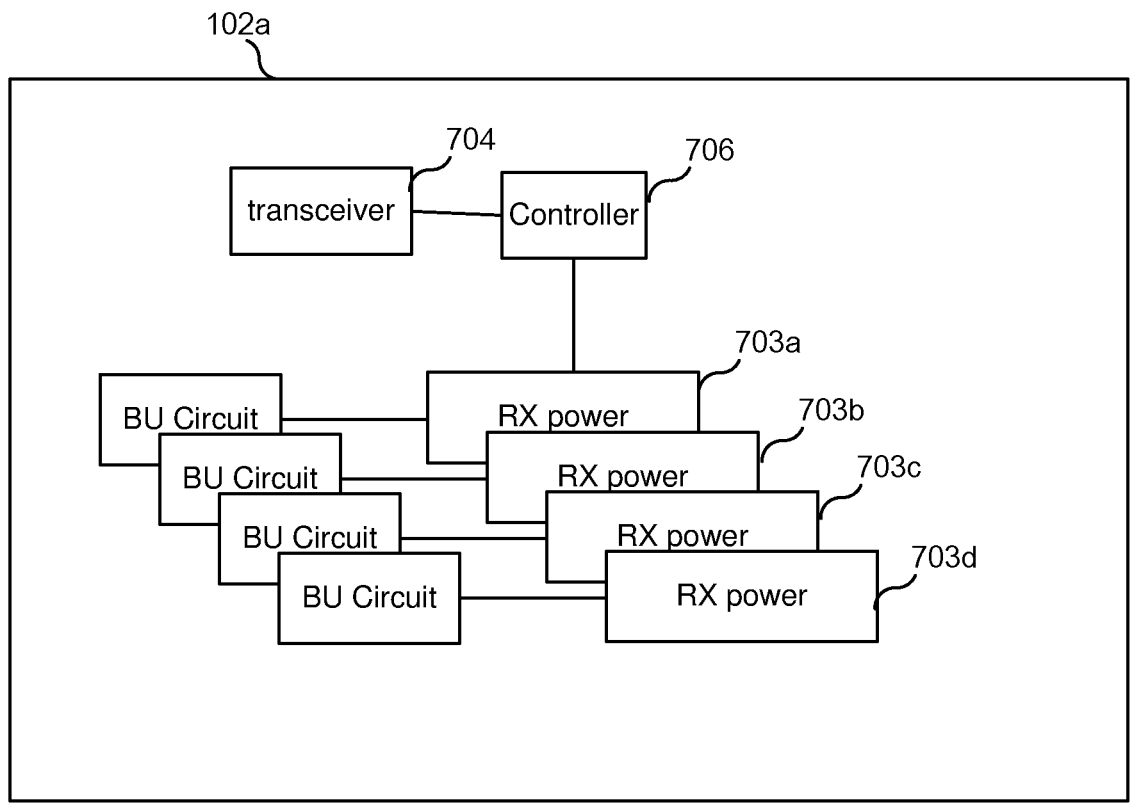
FIG. 8 is a functional block diagram of an BU according to some embodiments.

FIG. 8 illustrates an embodiment of BU 102 in which BU 102 includes more than one wireless RX power unit 703 (in the example shown BU 102 includes four wireless RX power units 703a, 703b, 703c, and 703d). In the example shown, each wireless RX power unit 703 powers a different BU circuit of BU 102.

Figure 9:
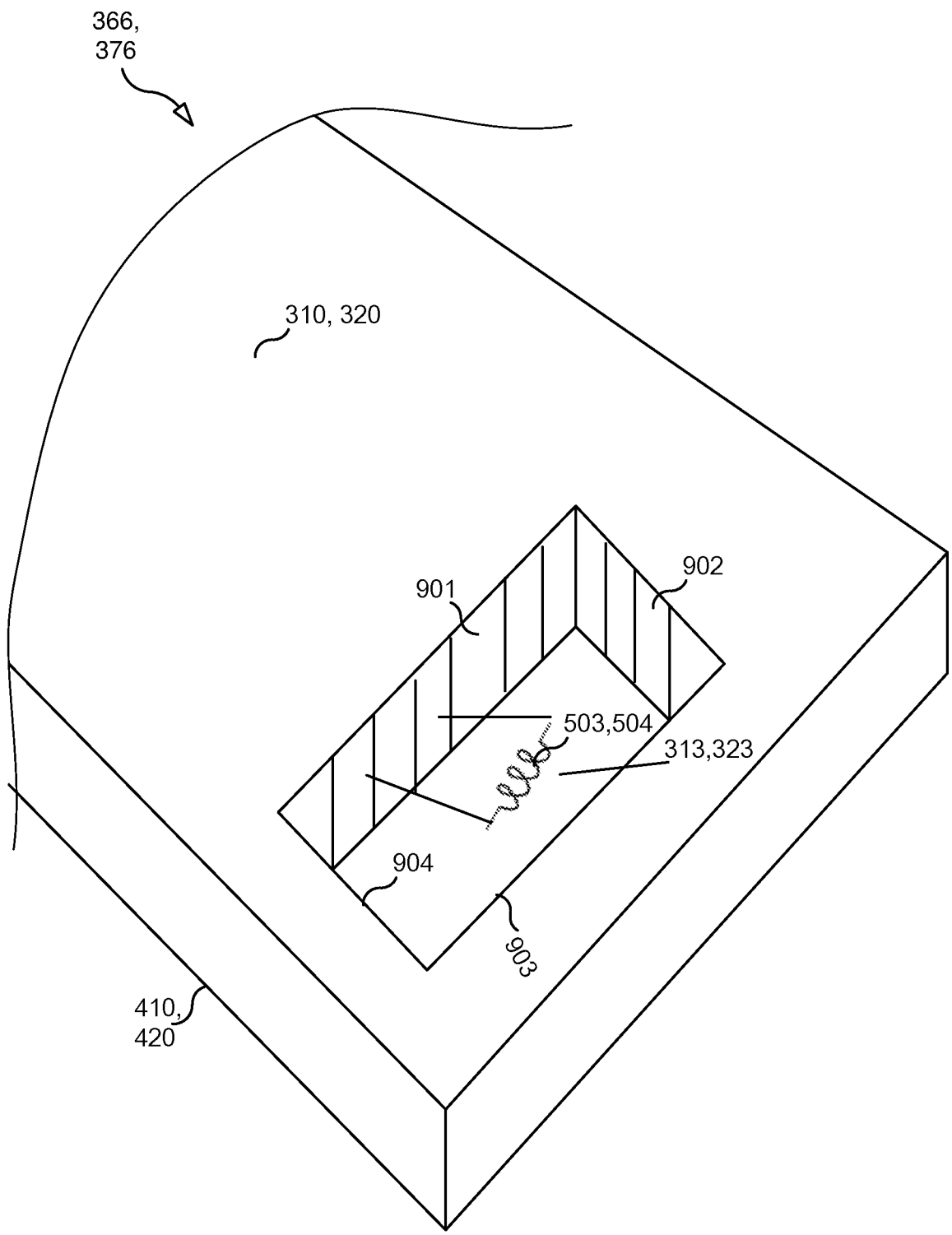
FIG. 9 further illustrates a BU/PSU housing.

FIG. 9 further illustrates BU housing 366 and PSU housing 376. More specifically, FIG. 9 illustrates that housings 366, 376 may include an EF shield wall 901 that extends from the main wall 310,320 to the main wall 410, 420 of housings 366, 376, respectively. As shown, the wall 901 extends along a side of hole 313, 323. The purpose of EF shield wall 901 is to provide EF shielding. That is, wall 901 functions to prevent electrical components within housing 366, 376 from being exposed to the energy field generated by the coil 502, 504. As further shown in FIG. 9, housing 366, 376 may also include EF shield walls 902, 903, and 904, each of which extends along a side of hole 313, 323 and extends from the main wall 310, 320 to the main wall 410, 420.

While various embodiments have been described above, it should be understood that they have been presented by way of example only, and not limitation. Thus, the breadth and scope of the present invention should not be limited by any of the above-described exemplary embodiments. Moreover, any combination of the above-described elements in all possible variations thereof is encompassed by the invention unless otherwise indicated herein or otherwise clearly contradicted by context.

The invention claimed is:

1. A radio base station (RBS), the RBS comprising:
   a first base station unit (BU) comprising a first BU housing that houses a first BU circuit and a first wireless receive (RX) power unit for providing power to the first BU circuit, the first wireless RX power unit comprising a first RX power circuit comprising a first RX coil for generating a current and a voltage from an energy field; and
   a second BU comprising a second BU housing that houses a second BU circuit and a second wireless RX power unit for providing power to the second BU circuit, the second wireless RX power unit comprising a second RX coil; and
   a power supply unit (PSU) comprising a PSU housing that houses a wireless transmit (TX) power module comprising a TX power circuit comprising a TX coil, wherein
   the first BU housing has a first main wall, a second main wall parallel with the first main wall, and four side walls extending between the first and second main walls of the first BU housing, the first main wall of the first BU housing has a first hole, and the first RX coil is positioned adjacent the first hole,
   the PSU housing has a first main wall, a second main wall parallel with the first main wall, and four side walls extending between the first and second main walls of the PSU housing, the second main wall of the PSU housing has a second hole, and the TX coil is positioned adjacent the second hole,
   the PSU housing is located relative to the first BU housing such that said first and second holes are aligned so that an energy field generated by the TX coil is received by the first RX coil thereby inducing a current and a voltage in the first RX coil for use in powering the first BU,
   the second BU housing has a top wall, a bottom wall, and four side walls extending between the top and bottom walls, the top wall of the second BU housing has a third hole, and the second RX coil is positioned below the third hole in the top wall of the second BU housing,
   the first main wall of the PSU housing has a fourth hole,
   the PSU housing is located between the first BU housing and the second BU housing such that the top wall of the second BU housing and the first main wall of the PSU housing face each other, and the first wireless RX power unit is configured such that, when the first BU's power needs change, the first wireless RX power unit alters a resonant frequency of the first RX power circuit and transmits a command to a controller to cause the controller to alter a resonant frequency of the TX power circuit.

2. The RBS of claim 1, wherein the first BU is a first radio unit (RU) and the second BU is a second RU.

3. The RBS of claim 2, wherein the first BU circuit comprises a first power amplifier coupled to an antenna via a duplex filter and the second BU circuit comprises a second power amplifier coupled to an antenna via a duplex filter.

4. The RBS of claim 1, further comprising:

a first electromagnetic interference (EF) shield located on an outer surface of the first main wall of the first BU housing and surrounding the first hole;

a second EF shield located on ran outer surface of the second main wall of the PSU housing and surrounding the second hole, wherein the first BU housing further comprises an EF shield wall that extends between the first and second main walls of the first BU housing and that extends along a side of the first hole, and the PSU housing further comprises an EF shield wall that extends between the first and second main walls of the PSU housing and that extends along a side of the second hole.

5. The RBS of claim 1, wherein the first hole is in an outer surface of the first main wall.

* * * * *